Feb. 26, 1963 R. E. ANDERSON ET AL 3,079,287

IMPROVED GROWN JUNCTION TRANSISTOR AND METHOD OF MAKING SAME

Filed Sept. 1, 1959 3 Sheets-Sheet 1

INVENTORS
Robert E. Anderson
& Walter R. Runyan

BY Stevens, Davis, Miller & Mosher
ATTORNEYS

INVENTORS
Robert E. Anderson &
Walter R. Runyan
BY Stevens, Davis, Miller & Mosher
ATTORNEYS INVENTORS
Robert E. Anderson &
Walter R. Runyan
BY Stevens, Davis, Miller & Mosher
ATTORNEYS United States Patent Office 3,079,287
Patented Feb. 26, 1963

3,079,287

IMPROVED GROWN JUNCTION TRANSISTOR AND METHOD OF MAKING SAME

Robert E. Anderson, Kingsville, and Walter R. Runyan, Dallas, Tex., assignors to Texas Instruments Incorporated, Dallas, Tex., a corporation of Delaware Filed Sept. 1, 1959, Ser. No. 837,526
9 Claims. (Cl. 148—1.5)

Figure 1:
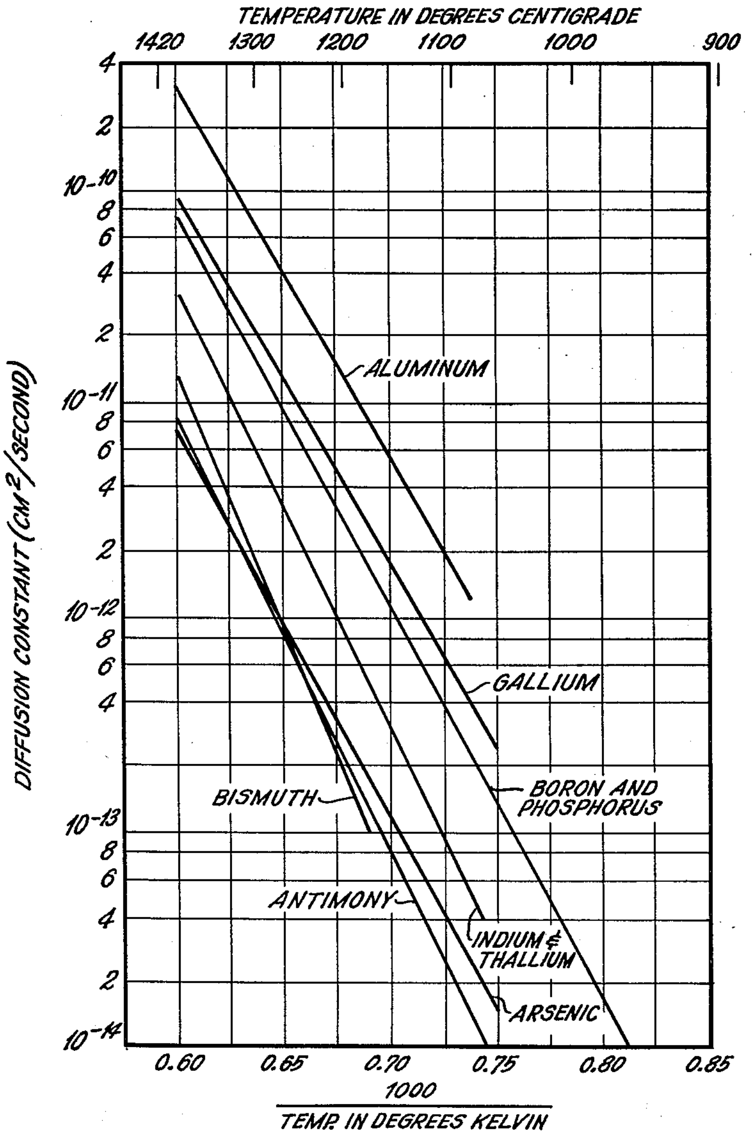

This invention relates to an improved transistor and more particularly to a method of producing an improved transistor having a controlled base thickness and a reduced collector capacitance. The transistor produced by the present invention is characterized by an extremely thin base layer obtained by an impurity diffusion process.

Grown junction NPN silicon transistors produced by present techniques are excellent for use in many low frequency applications but certain of their inherent characteristics severely limit their usefulness at higher frequencies. For example, the relatively short carrier lifetime in silicon makes it imperative that for high frequency operation with useful values of gain, the P layers be extremely thin and be of a relatively low resistivity. Using a double doping technique of producing grown junction crystals, the P layer width is controlled by the elapsed time between the introduction of P dope and the introduction of the $N_2$ dope. However, it has been found that there exists a lower limit to the control of the P layer width in silicon crystals obtained by timing the delay before introducing the $N_2$ dope. It has been discovered that a reduction of the elapsed time between P and $N_2$ doping below approximately 12 seconds produces no corresponding reduction of P layer width. In fact, no significant difference in the P layer width of two crystals could be determined, one in which the P and $N_2$ dopes were added to the silicon melt simultaneouly during the growth of the crystal and one in which the $N_2$ dope was not added until 12 seconds after the addition of the P dope. The logical explanation for this phenomenon lies in the difference in the diffusion rate of the N and P type doping materials in silicon. The commonly used P type doping materials such as aluminum, gallium, boron, indium and thallium diffuse into silicon at a much faster rate than do the commonly used N type doping materials such as bismuth, antimony, arsenic and in some cases phosphorous. Thus, even though the P dope and N dope are added to the melt simultaneously, a P layer is formed by the P dope diffusing into the solid crystal at a much faster rate than the N dope. The diffusion of the P dope causes a resultant conversion of the freshly-grown slightly N type portion of the crystal to P type. The resultant P layer is approximately the same width as the P layer obtained when as much as 10 to 12 seconds delay is incorporated between the addition of the P dope and the $N_2$ dope. The width of this P layer varies, because of the described uncontrollable factors of the process, over a range of about 0.1 mil to about 0.7, mil, centered at about 0.3 mil.

The present invention provides a method of producing a base layer in an NPN silicon transistor crystal much narrower than heretofore possible. In fact, the layer is so narrow that no means have yet been found to measure it and practically the only indication of its presence is the fact that bars cut from crystal will function as transistors. However, it is estimated that the layer must be approximately 0.05 mil in width. According to the present invention, the NPN silicon crystal is grown in the usual manner as described above except that the $N_2$ portion of the crystal is much more highly doped than in other techniques. After the crystal has been removed from the crystal puller and cut into bars, the bars are heated and held at some convenient diffusion temperature. Diffusion of the impurities will then take place, but instead of forming or broadening the base or P layer as would occur in the methods previously described, the base layer will narrow due to the high concentration of $N_2$ impurities in the adjacent section. Thus, although the P impurities diffuse at a faster rate than do the N impurities, the N impurities are present in so much greater concentration that instead of the P impurities converting the conductivity type of portions of the original $N_2$ region which would broaden the base layer, enough of the N type impurities will diffuse into and convert the portions of the original P region to narrow it appreciably.

It is therefore one object of the present invention to provide a method of producing grown junction transistors having much narrower base regions than possible by previously known methods.

It is another object of the present invention to provide grown junction transistors with essentially higher gains than previously attainable.

It is a further object of the present invention to provide a grown junction transistor having useful values of gain at high frequency.

It is still a further object of the present invention to provide a method of producing large quantities of transistors having base layers of a uniform, narrow width.

Figure 2:
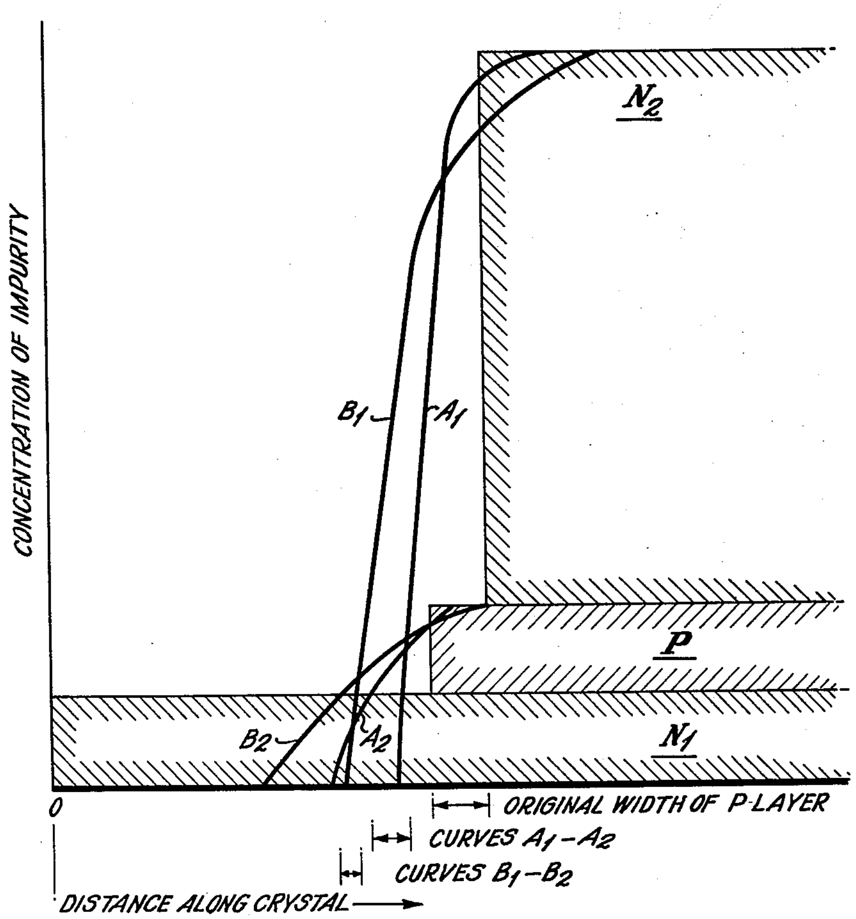
Figure 3:
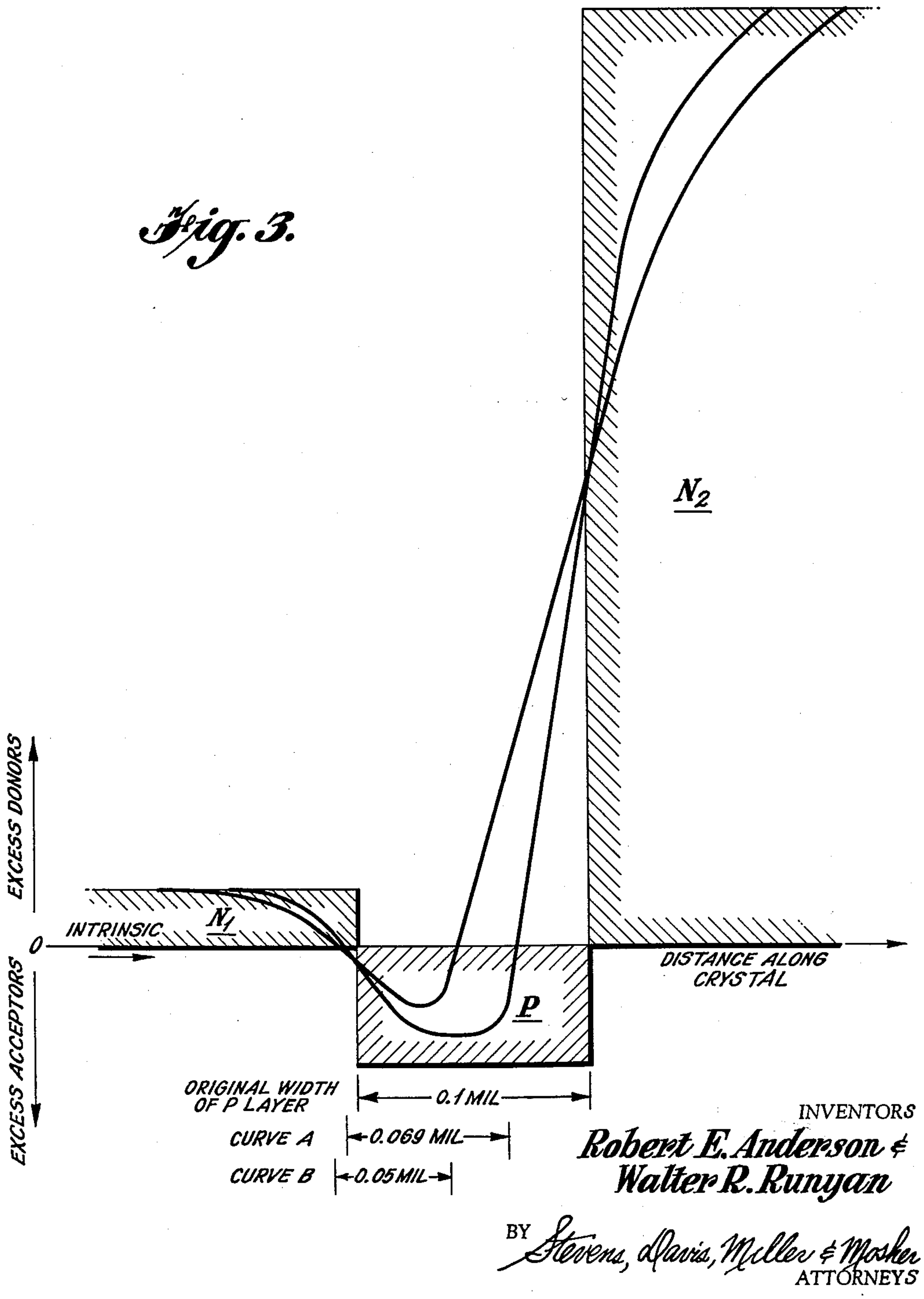

Other objects and further details of the present invention are disclosed in the following detailed discussion and the accompanying drawings in which:

FIGURE 1 is a logarithmic plot of the diffusion constants in square cm. per second against temperature, in degrees C. on the top abscissa scale and the temperature function, 1000 over temperature in degrees Kelvin, along the bottom abscissa scale, for the donor and acceptor impurities in silicon;

FIGURE 2 is a graphic representation of the logarithm of the impurity concentration for distances along a crystal illustrating a manner in which impurity diffusion causes a narrowing of the P layer even though the diffusion rate of the P impurity is faster than the diffusion rate of the $N_2$ impurity; and FIGURE 3 is a graphic representation of excess donors and acceptors for distances along the crystal again illustrating the manner in which the narrowing of the base layers results from diffusion of the impurities.

Referring now to the drawing of FIGURE 1, there are illustrated the diffusion constants in centimeters squared per second for several acceptor and donor impurities in silicon over a range of temperatures from about 1000° C. to about 1400° C. It will be noted that with only one exception, phosphorous, all of the comomnly used donor impurities, antimony, arsenic and bismuth, diffuse in silicon at a much slower rate than do the commonly used acceptor impurities, indium, gallium, thallium, aluminum and boron.

Thus, in a sample of silicon containing a PN junction, if the concentration of donor impurities in the N zone is the same as the concentration of acceptor impurities in the P zone, then heat will cause the junction to become more graded and to shift into the N type zone, that is, cause the P zone to expand. The rate of expansion of the P zone and the degree of grading of the junction will depend on four things, the diffusion constant of the P impurity, the diffusion constant of the N impurity, the concentration of the P impurity and the concentration of the N impurity. As can be noted from FIGURE 1, the relative diffusion constants of the various impurities are fairly constant through the range of temperature shown with most of the N impurity diffusion constants increasing slightly more rapidly with temperature than most of the P impurity diffusion constants. The diffusion temperature then, effects some control over the rate of expansion of the P zone. However, it has been discovered that a much greater control of the expansion rate can be effected through differences in initial impurity concentration in the two types of impurities in their respective zones. In fact, it has been found that by proper selection of impurities and their concentration, diffusion from the N zone can be made to override the diffusion from the P zone such that the N zone expands instead of the P zone.

The above is illustrated in FIGURES 2 and 3 which portray graphically curves showing the manner of utilizing differences in impurity concentrations to produce expansion of the $N_2$ region in a silicon transistor and a narrowing of the P region, notwithstanding the fact that the P type impurities diffuse at a faster rate than the N type impurities.

Referring first to FIGURE 2, there is shown a graph of concentration of impurities in a silicon crystal plotted versus distance along the silicon crystal. As noted, the $N_1$ impurity is chosen within conventional limits as is the P impurity. However, the $N_2$ impurity is present in substantially greater quantity. In order to give a better understanding of the invention, there will be provided specific values for each of the $N_1$ and $N_2$ impurity concentrations and the P impurity concentration. For example, the $N_1$ region of the crystal may contain sufficient N type impurity to impart a resistivity of from about 0.01 to about 5 ohm-centimeters. A quantity of P type impurity is added in the amount $10^{17}$ impurity atom per cubic centimeter. The amount of $N_2$ impurity added to the crystal is quite large and in the range of $10^{18}$ to $10^{20}$ impurity atoms per cubic centimeter. It is evident that the amount of $N_2$ impurity used is an abnormally large concentration when it is realized that the amount of $N_2$ impurity which would normally be added for the quantity of P type impurity used would be in the range of $5\times10^{17}$ impurity atoms per cubic centimeter. The amount of $N_2$ impurity required will be dependent upon the amount of P type impurity used and the choice of impurities and the diffusion coefficient of the impurities used. The resulting construction is a conventional NPN type silicon transistor with the $N_2$ region constituting the emitter of the device. The unit is fabricated in accordance with known techniques, as for example, a conventional double doping technique. The P layer has a width as indicated in FIGURE 2 and this may be from about 0.1 mil to about 1 mil. For sake of discussion, it will be presumed that the width of the P layer in the original transistor device is 0.1 mil.

Curves $A_1$ and $A_2$ illustrate what takes place in the device when it is subjected to a diffusion temperature. It will be appreciated that diffusion temperatures can be selected from FIGURE 1. The diffusion temperatures employed in the process are from about 900° C. to about 1400° C. Customarily, about 1350° C. is taken as a convenient diffusion temperature. Curves $A_1$ and $A_2$ are produced by diffusing at a convenient temperature for a preselected or predetermined time. As a result, diffusion of the $N_2$ impurity occurs into the P region. At the same time, diffusion of the P type impurity occurs into the $N_1$ region. Although the P type impurity diffuses much faster into the $N_1$ region than the $N_2$ impurity diffuses into the P region, nevertheless the larger quantity of the $N_2$ impurity offsets this rate difference and instead of the P layer broadening it is actually narrowed to about 0.07 mil.

If the diffusion is permitted to continue for a longer period of time or at a higher temperature, or both, there will be produced a further narrowing of the P layer. This is illustrated by curves $B_1$ and $B_2$. It will be noted that the P layer has been narrowed to about 0.05 mil in this case.

The above is also illustrated in FIGURE 3, shown in a different way. In FIGURE 3, the excess donors are indicated above the center axis, whereas excess acceptors are indicated below the center axis. The concentration of excess impurity is plotted in the graph with respect to the center axis. As will be apparent, FIGURE 3 follows very closely the disclosure of FIGURE 2 in that a conventional amount of $N_1$ impurity is present, a conventional amount of P impurity is present and an abnormally large concentration of $N_2$ impurity is present. The result of using the concentrations as indicated, produces an NPN transistor having a base width or P layer width of about 0.1 mil. The device may be produced by a conventional double doping technique or other known technique. When the device is then subjected to a diffusion temperature which, as noted previously, is from about 900° C. to about 1400° C., for a predetermined time, for example from 10 minutes to 24 hours, there will result a narrowing of the P layer. This is brought about, notwithstanding the fact that the P type impurity will diffuse faster into the $N_1$ region than the $N_2$ impurity will diffuse into the P region. Due to the abnormally large concentration of the $N_2$ impurity, the faster diffusion rate is overcome and the P layer will be narrowed. Curve A illustrates what results from subjecting the device to a particular diffusion temperature and time and indicates a narrowing of the P layer from 0.1 mil to about 0.069 mil. Curve B illustrates what results using another diffusion temperature and time. In the circumstances of curve B, either the diffusion temperature is higher or the time longer, or both. Curve B shows a further narrowing of the P layer to about 0.05 mil.

The P and N type impurities which may be employed for the process are any of those shown in the graph of FIGURE 1. It will be appreciated that the P type impurities diffuse faster than the N type impurities in practically all cases. As specific examples of impurities which may be used in the process of the present invention, consider the following combinations: boron and phosphorous, indium and bismuth, indium and antimony, thallium and antimony or arsenic, gallium and antimony, gallium and arsenic, as well as any other combination as may appear in FIGURE 1.

Although the present invention has been shown and described in terms of a specific embodiment, nevertheless it will be appreciated that various changes and modifications will be obvious to those skilled in the art from a knowledge of the teachings of the present invention. For example, materials other than silicon such as germanium could be used in which event the transistor would be of the PNP type rather than the NPN type shown and specifically described. Such modifications and changes which do not in fact depart from the spirit, scope and contemplation of the invention are deemed to come within the purview of the invention.

What is claimed is:

1. A transistor characterized by a narrow base region that comprises a collector region of one conductivity type, a base region containing an excess impurity concentration consisting of an impurity material of opposite conductivity type, and an emitter region containing an excess impurity concentration consisting of an impurity material of said one conductivity type, said impurity material of opposite conductivity-type being characterized by a diffusion rate not greatly in excess of that of said impurity material of said one conductivity-type, said emitter region including a first portion spaced from the base region containing an abnormally large concentration of impurity atoms of said one conductivity type and a second portion contiguous to said base region and to said first portion and of said one conductivity type, said second portion being formed in the original base region whereby said base region is narrowed, said second portion having a steep impurity concentration gradient over its entire width with the higher concentration being adjacent said first region, the width of said second portion being a substantial fraction of the original base width.

2. A transistor characterized by a narrow base region that comprises a collector having a concentration of donor impurities of from $10^{15}$ to $10^{16}$ atoms per cubic centimeter, a base region having a concentration of acceptor impurities of from $10^{16}$ and $10^{17}$ atoms per cubic centimeter, and emitter region, said emitter region including a first portion spaced from the base region containing an abnormally large concentration of donor impurities of from $10^{18}$ to $10^{20}$ atoms per cubic centimeter and a second portion contiguous to said base region and to said first portion and containing an excess of donor impurities, said second portion being formed in the original base region whereby said base region is narrowed, said acceptor impurities being characterized by a diffusion rate not greatly in excess of that of said donor impurities, said second portion having a steep impurity concentration gradient over its entire width with the higher concentration being adjacent said first region, the width of said second portion being a substantial fraction of the original base width.

3. A transistor characterized by a narrow base region that comprises a collector having a concentration of donor impurities of from $10^{15}$ to $10^{16}$ atoms per cubic centimeter, a base region having a concentration of $10^{16}$ to $10^{17}$ boron atoms per cubic centimeter, and an emitter region, said emitter region including a first portion spaced from the base region containing an abnormally large concentration of from $10^{18}$ to $10^{20}$ atoms per cubic centimeter of phosphorus and a second portion contiguous to said base region and to said first portion and containing an excess of phosphorous atoms, said second portion being formed in the original base region whereby said base region is narrowed, said second portion having a steep impurity concentration gradient over its entire width with the higher concentration being adjacent said first region, the width of said second portion being a substantial fraction of the original base width.

4. The method of producing a silicon transistor characterized by a narrow base region less than 0.1 mil thick that comprises the steps of growing a silicon crystal consisting of a collector region doped with a concentration of $10^{15}$ to $10^{17}$ excess donor impurity atoms per cubic centimeter, a base region doped with an excess concentration of $10^{16}$ to $10^{18}$ boron atoms per cubic centimeter, an emitter region doped with an abnormally high excess impurity concentration of $10^{18}$ to $10^{20}$ phosphorous atoms per cubic centimeter, and subjecting said crystal to a temperature of from about 900° C. to about 1400° C. for a time sufficient to cause diffusion of said phosphorus atoms into the said base and collector regions to an extent exceeding the diffusion of said boron atoms into said collector region whereby the net effect is a reduction in base width.

5. A method of producing a silicon transistor characterized by a narrow base region less than 0.1 mil thick comprising the steps of growing a collector region of one conductivity-type, growing a base region containing an excess concentration of conductivity-determining impurity material of the opposite type, growing an emitter region containing a large excess concentration of conductivity-determining impurity materials of said one type, said impurity materials in said base and emitter regions having substantially the same values of diffusion coefficients, and thereafter heating said transistor at a temperature of from about 900° C. to about 1400° C. to provide appreciable diffusion of said impurity materials and a decrease in the width of the base region by a substantial fraction of the original width thereof.

6. The method of claim 5 wherein said impurities in the base and emitter regions are boron and phosphorous, respectively.

7. A method of producing a silicon transistor characterized by a narrow base region comprising the steps of growing a collector region of one conductivity-type, growing a base region containing an excess concentration of conductivity-determining impurity material of the opposite type, growing an emitter region containing a large excess concentration of conductivity-determining impurity materials of said one type, said impurity materials in the base and emitter regions being selected from the group consisting of the combination pairs of boron and phosphorous, indium and bismuth, indium and antimony, thallium and antimony, thallium and arsenic, gallium and antimony, and gallium and arsenic, and thereafter heating said transistor at a temperature of from about 900° C. to about 1400° C. to provide appreciable diffusion of said impurity materials and a substantial net decrease in the width of the base region.

8. A method of decreasing the thickness of the base region of an NPN silicon transistor containing an abnormally high impurity concentration of from about $10^{18}$ to about $10^{20}$ atoms/cm.$^3$ in the emitter and a moderately fast diffusing base impurity comprising the step of subjecting said transistor to a temperature of from about 900° C. to about 1400° C. for a time sufficient to provide appreciable diffusion of said impurities, the diffusion of the emitter impurity into the base exceeding the diffusion of the base impurity into the collector whereby the net effect is a reduction in base thickness.

9. A method of decreasing the thickness of the base region of an NPN silicon transistor containing an abnormally high impurity concentration in the emitter of from about $10^{18}$ to about $10^{20}$ atoms/cm.$^3$ comprising the step of subjecting said transistor to a temperature of from about 900° C. to about 1400° C. for a time sufficient to provide appreciable diffusion of impurity materials therein, the diffusion from the emitter into the base exceeding the diffusion from the base into the collector due to the high impurity concentration in the emitter and due to the fact that the diffusion coefficient of the impurity material in the base is not greatly in excess of that of the impurity material in the emitter.

References Cited in the file of this patent

UNITED STATES PATENTS

| | | |
|---|---|---|
| 2,818,361 | Anderson | Dec. 31, 1957 |
| 2,870,052 | Rittmann | Jan. 20, 1959 |
| 2,878,152 | Runyan | Mar. 17, 1959 |
| 2,899,343 | Statz | Aug. 11, 1959 |